(12) United States Patent
Fang

(10) Patent No.: US 7,320,615 B2
(45) Date of Patent: Jan. 22, 2008

(54) GROUNDING SPRING PLATE FOR BLADE SERVER AND ITS MOUNTING STRUCTURE

(75) Inventor: Chih-Liang Fang, Hsintien (TW)

(73) Assignee: Adlink Technology Inc., Taipei Hsien (TW)

( * ) Notice: Subject to any disclaimer, the term of this patent is extended or adjusted under 35 U.S.C. 154(b) by 0 days.

(21) Appl. No.: 11/567,722

(22) Filed: Dec. 6, 2006

(65) Prior Publication Data

US 2007/0093092 A1    Apr. 26, 2007

Related U.S. Application Data

(63) Continuation-in-part of application No. 11/162,002, filed on Aug. 25, 2005, now abandoned.

(51) Int. Cl.
*H01R 13/64* (2006.01)
(52) U.S. Cl. ..................................... 439/377
(58) Field of Classification Search ............... 439/64, 439/377; 361/756, 753, 799, 802
See application file for complete search history.

(56) References Cited

U.S. PATENT DOCUMENTS

| 4,019,099 | A | * | 4/1977 | Calabro | 361/756 |
| 5,187,648 | A | * | 2/1993 | Ito | 361/816 |
| 5,533,631 | A | * | 7/1996 | Marchetti | 211/41.17 |
| 5,805,429 | A | * | 9/1998 | Andersson | 361/799 |
| 6,780,043 | B2 | * | 8/2004 | Malmberg | 439/377 |

* cited by examiner

Primary Examiner—Neil Abrams

(57) ABSTRACT

A grounding spring plate mounting structure includes a metal grounding spring plate mounted on each track inside a case for blade server to secure and ground a computer motherboard blade. The metal grounding spring plate has a flat base fitted into a recessed portion of the track, two channel-like mounting frames disposed at two sides of the flat base and respectively mounted on two parallel rails of the track and defining with the flat base a guide passage for receiving the inserted computer motherboard blade, and two clamping spring arms respectively extending from the channel-like mounting frames and suspending in the guide passage for clamping the inserted computer motherboard blade from two opposite sides and constituting with the inserted computer motherboard blade a grounding loop.

16 Claims, 14 Drawing Sheets

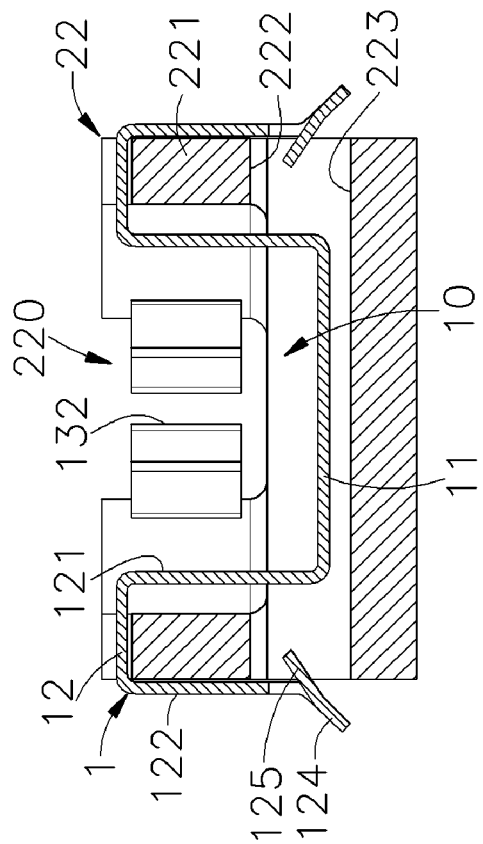
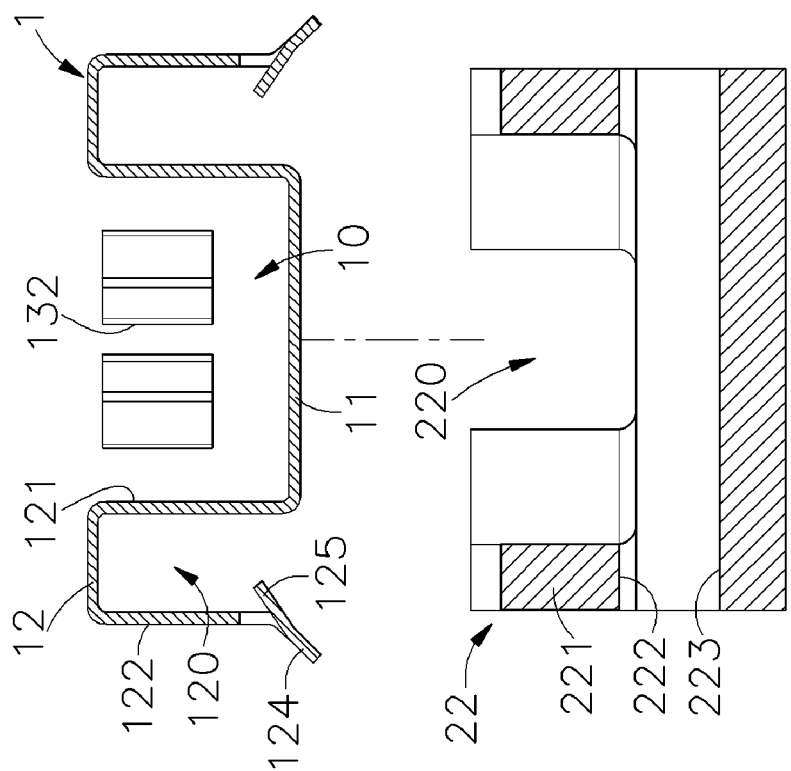
FIG. 5
FIG. 6

GROUNDING SPRING PLATE FOR BLADE SERVER AND ITS MOUNTING STRUCTURE

This application is a Continuation-In-Part of my patent application, Ser. No. 11/162,002, filed on Aug. 25, 2005 now abandoned.

BACKGROUND OF THE INVENTION

1. Field of the Invention

The present invention relates to a blade server and more particularly, to a grounding spring plate for use in a ATCA blade server that can conveniently and detachably mounted in a track inside a case for ATCA blade server to secure and ground a computer motherboard blade.

2. Description of the Related Art

Currently, many enterprises install several tens or even several hundreds of mini servers to satisfy network traffic requirements. In order to improve further economic effect, blade servers are developed. A blade server is essentially a housing for a number of individual minimally-packaged computer motherboard "blades", each including one or more processors, computer memory, computer storage, and computer network connections, but sharing the common power supply and air-cooling resources of the chassis. The idea is that by placing many blades in a single chassis, and then 19-inch rack-mounting them, systems can be more compact and powerful, but less expensive than traditional systems based on mainframes, or server farms of individual computers (see Blade server from Wikipedia).

The most attractive advantage of a blade server is its high reliability and extendibility. Every blade server has the backup function. The hot plugging of the server machine case that supports blade servers and system component parts provides high applicability. When one individual blade server failed, another blade server can take the place without interrupting the service of the system. When wishing to increase the processing power of the system, it needs only to insert more blade servers and to arrange these resources at the place where the demand is most strong.

Further, a case for ATCA blade server generally has multiple tracks mounted therein for the insertion of multiple computer motherboard blades. However, when inserting a computer motherboard blade into one track inside the case, the computer motherboard blade may vibrate and rub against the neighbor computer motherboard blade accidentally, thereby damaging motherboard or the related electronic component parts. After insertion of one computer motherboard blade into one track, screws are commonly used to affix the inserted computer motherboard blade to the respective track.

Further, a computer motherboard blade generally has a grounding spring member at one side for constituting with the case of the blade server a grounding loop. However, when mounting or dismounting a computer motherboard blade, the grounding spring member may be damaged or forced out of place accidentally.

FIGS. 11~13 show a conventional design for securing a computer motherboard blade in a blade server. As illustrated, tracks B are fixedly mounted inside a metal case A for holding a respective computer motherboard blade A1. Each track B comprises two countersunk holes B2 on the front and rear ends for mounting, two parallel rails B1, and a metal guide C mounted in between the rails B1 for guiding the inserted computer motherboard blade A1 into position. The metal guide C comprises a plurality of clamping plates C1 symmetrically disposed at two sides, and a plurality of hooks C3 respectively extended from the clamping plates C1 at the bottom side. During installation, the metal guide C is inserted in between the rails B1 from the bottom side to force the locating holes C11 of each clamping plate C1 into engagement with a respective locating block B11 on the associating rail B1, and at the same time the hooks C3 are respectively hooked on the rails B1 at the bottom side. When one computer motherboard blade A1 is inserted into one track B inside the metal case A, the rails B1 and the clamping plates C1 of the metal guide C hold the inserted computer motherboard blade A1 in position. This computer motherboard blade mounting structure still has drawbacks as follows:

1. After mounting of the metal guide C in the track B, the base C2 of the metal guide C protrudes over the top surface of the track B. When inserting a computer motherboard blade A1 into the track B, the protruded base C2 of the metal guide C may hinder the insertion of the computer motherboard blade A1 or cause deformation of the inserted computer motherboard blade A1, or the inserted computer motherboard blade A1 may permanently deform the clamping plates C1 of the metal guide C.

2. When inserting one computer motherboard blade A1 into one track B, the bottom edge of the computer motherboard blade A1 is forced to rub against the surface of the base C2 of the metal guide C heavily. Further, the metal guide C has a plurality of holes C21 on its bottom panel that may hinder forward movement of the inserted computer motherboard blade A1 and cause damage to the inserted computer motherboard blade A1.

3. When the inserted computer motherboard blade A1 is set in position, the clamping plates C1 of the metal guide C are clamped on the computer motherboard blade A1 and electrically connect the grounding contacts of the computer motherboard blade A1 to the metal case A through the hooks C3, thereby constituting a grounding loop. The metal guide C is mounted on the track B, which is molded from plastics, and then kept in contact with the metal case A through the hooks C3. A dimensional error between the track B and the metal guide C or elastic fatigue of the hooks C3 for the inserted computer motherboard blade A1 may result in a contact error between the hooks C3 and the metal case A. Further, when repairing the metal guide C, the mechanic must remove the track B from the metal case A at first, and then remove the metal guide C from the track B for repair or replacement. After replacement or repair, the metal guide C must be mounted in the track B and then fastened with the track B to the inside of the metal case A again. This mounting and dismounting procedures are complicated.

FIGS. 14~16 show another prior art design of guide track for use in a blade server for holding a computer motherboard blade. According to this design, the guide track D has a longitudinal sliding groove D1 for receiving a computer motherboard blade, ribs D2 symmetrically arranged at two sides of the longitudinal sliding groove D1, angled positioning portions D3 respectively extended from the ribs D2 for fastening to a metal case for blade server (not shown), and triangular spring plates D4 arranged along one side of the longitudinal sliding groove D1. When inserting a computer motherboard blade (not shown) into the longitudinal sliding groove D1, the inserted computer motherboard blade forces the triangular spring plates D4 outwards from the longitudinal sliding groove D1. After insertion of the computer motherboard blade, the triangular spring plates D4 are clamped on one side of the computer motherboard blade, thereby holding the computer motherboard blade in position.

This design of guide track is still not satisfactory in function because of the following drawbacks:

1. When inserting a computer motherboard blade into the longitudinal sliding groove D1, the triangular spring plates D4 impart a pressure to one side of the computer motherboard blade. At this time, the protruding end of each triangular spring plate D4 may scratch the surface of the computer motherboard blade, leaving motherboard dust in the metal case of the blade server. Further, during movement of the computer motherboard blade into the longitudinal sliding groove D1, the bottom edge and one side of the computer motherboard blade opposite to the triangular spring plates D4 are heavily rubbed against the guide track D, producing a friction force that imparts a barrier to insertion of the computer motherboard blade.

2. The triangular spring plates D4 are arranged on one side of the longitudinal sliding groove D1 to give a pressure to the inserted computer motherboard blade from one side. Because the clamping force is not evenly applied to the inserted computer motherboard blade from two opposite sides, the clamping force is weak, and the computer motherboard blade may be forced out of place accidentally, causing shutdown of the computer motherboard blade or damage of storage data. Further, because of the uneven clamping force from the triangular spring plates D4 on the inserted computer motherboard blade, the triangular spring plates D4 may be damaged or deformed by the computer motherboard blade during insertion of the computer motherboard blade.

3. Further, the guide track D is fastened to the metal case of the blade server by means of its angled positioning portions D3. When the user touches one angled positioning portion D3 accidentally, the guide track D may be disconnected from the metal case of the blade server or forced out of position.

Therefore, it is desirable to provide a mounting structure for blade server that is easily detachable, holds the inserted computer motherboard blade positively in position, and assures positive grounding of the grounding terminal of the inserted computer motherboard blade.

SUMMARY OF THE INVENTION

The present invention has been accomplished under the circumstances in view. According to one aspect of the present invention, the grounding spring plate mounting structure comprises a plurality of tracks symmetrically arranged on top and bottom sides in an accommodation chamber inside a case for blade server, and a plurality of metal grounding spring plates respectively mounted on the tracks for securing computer motherboard blades in the tracks and grounding the inserted computer motherboard blades. Each track comprises two rails arranged in parallel, a sliding way defined between the rails for receiving a computer motherboard blade having grounding terminals on top and bottom sides of a motherboard thereof, and a recessed portion formed on the sliding way near a front opening of the case. The metal grounding spring plates each comprises a flat base fitted into the recessed portion of the associating track, two channel-like mounting frames disposed at two sides of the flat base and respectively mounted on the rails of the associating track and defining with the flat base a guide passage in communication with the sliding way of the associating track for receiving the computer motherboard blade being inserted into the sliding way of the associating track, and two clamping spring arms respectively extending from the channel-like mounting frames and suspending in said guide passage for clamping the inserted computer motherboard blade from two opposite sides.

According to another aspect of the present invention, each track has a crevice defined between each of its two rails and its recessed portion. Further, the channel-like mounting frames each have a finger strip respectively outwardly extending from the bottom side of the respective vertical outer side panel thereof and a plurality of projections respectively protruded from the finger strip for engaging into the corresponding crevice to secure the respective channel-like mounting frame to the associating rail of the associating track. When pulling the finger strips outward, the projections are disengaged from the respective crevices, allowing removal of the metal grounding spring plate from the associating track.

According to still another aspect of the present invention, the two clamping spring arms of each metal grounding spring plate are respectively forwardly extended from the channel-like mounting frames of the respective metal grounding spring plate and then turned backwards toward the inside of the guide passage above the flat base of the respective metal grounding spring plate for clamping the inserted computer motherboard blade from two opposite sides to hold the inserted computer motherboard blade positively in position. Further, the clamping spring arms each have an oblique guide portion that guide the inserted computer motherboard blade into the guide passage for enabling the curved clamping portions of the clamping spring arms to clamp the inserted computer motherboard blade and to touch the grounding terminal at the bottom side of the motherboard of the inserted computer motherboard blade positively.

BRIEF DESCRIPTION OF THE DRAWINGS

FIG. 5 is a cross sectional view of FIG. 3.

FIG. 6 is a sectional view taken along line A-A of FIG. 4.

DETAILED DESCRIPTION OF THE PREFERRED EMBODIMENT

Figure 7:
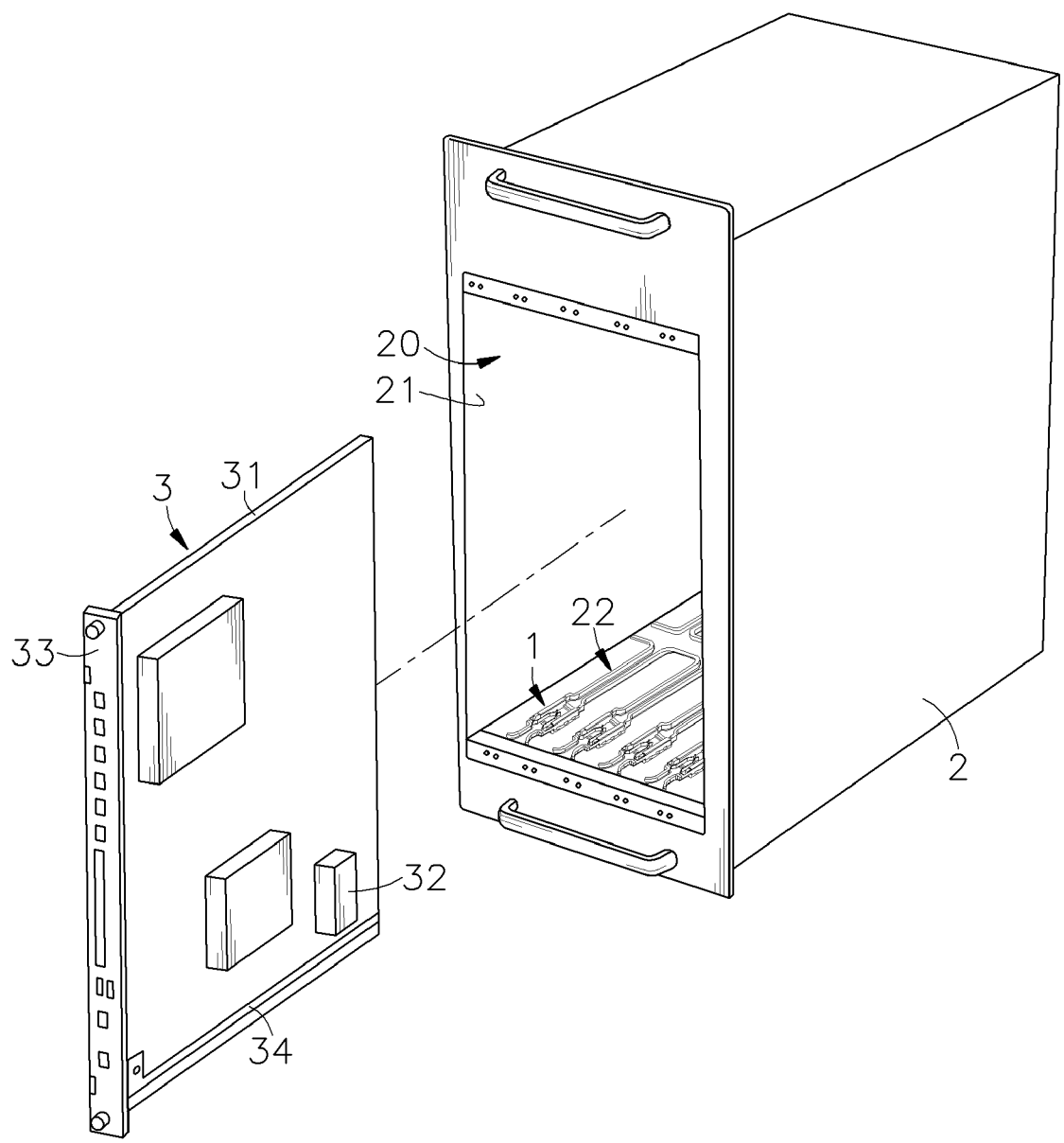
FIG. 7 is an exploded view of a part of a server constructed according to the present invention.

Referring to FIG. 7, grounding spring plates 1 are mounted inside a case 2 of a server to hold computer motherboard blades 3.

Figure 1:
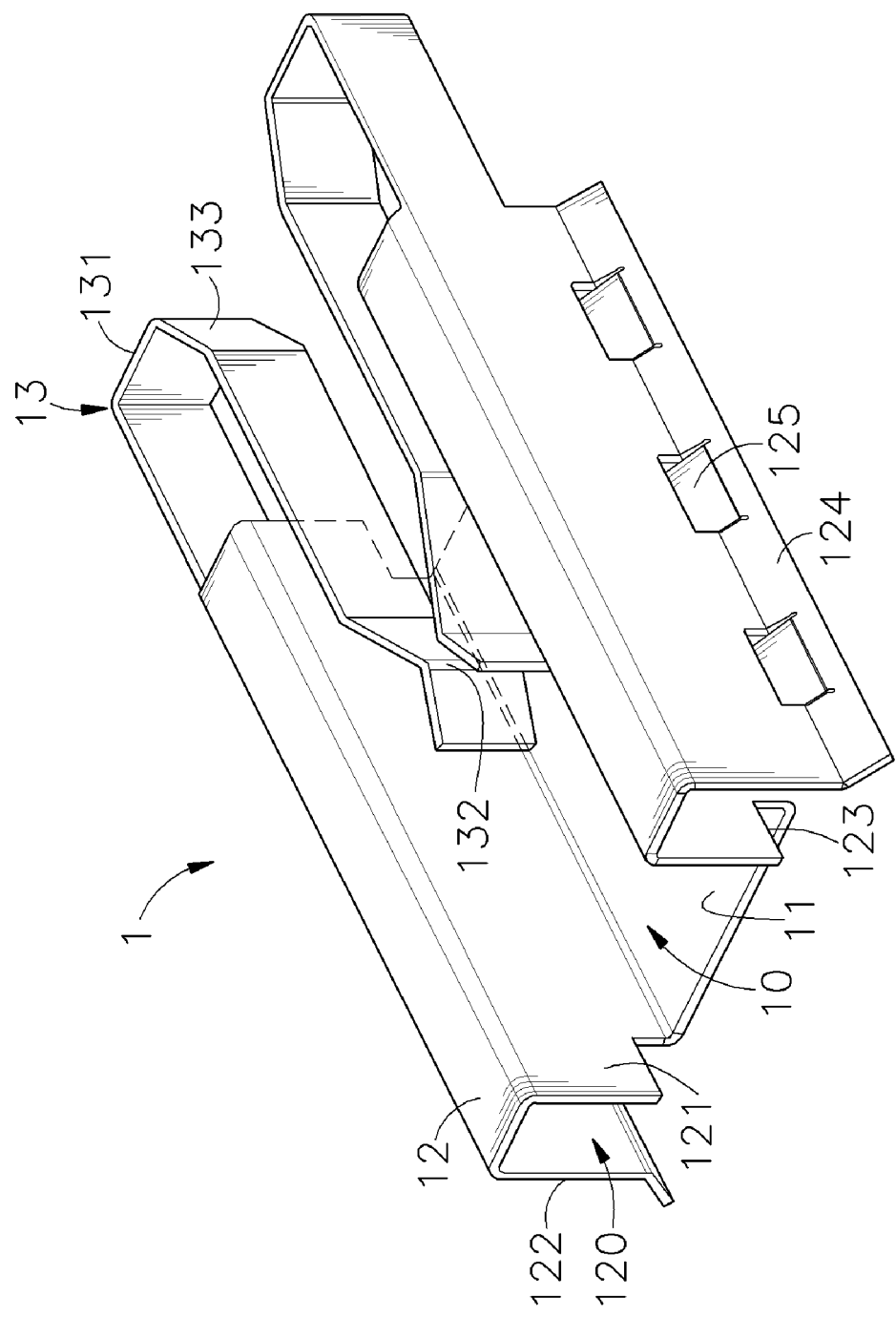
FIG. 1 is a perspective view of a grounding spring plate according to the present invention.
Figure 2:
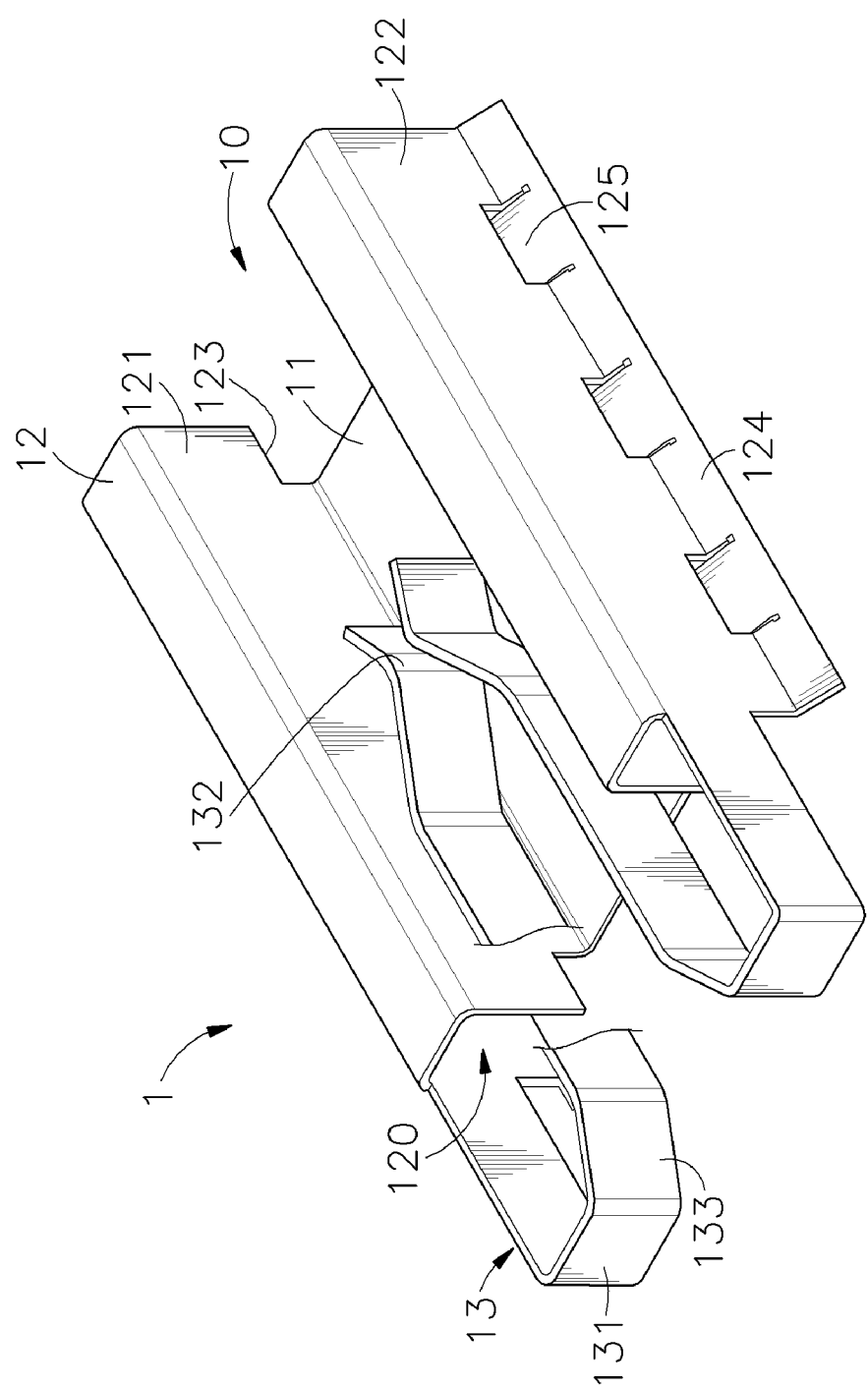
FIG. 2 corresponds to FIG. 1 when viewed from another angle.

FIGS. 1 and 2, each of the aforesaid grounding spring plates 1 is made of a metal material having a flat base 11, two channel-like mounting frames 12 arranged at two sides of the flat base 11 in a substantially parallel manner and defining therebetween a guide passage 10 above the flat base 11, and two clamping spring arms 13 respectively extended from the channel-like mounting frames 12. Each channel-like mounting frame 12 has a vertical inner side panel 121 perpendicularly upwardly extended from the flat base 11, a vertical outer side panel 122 arranged in parallel to the vertical inner side panel 121 and defining with the vertical inner side panel 121 a bottom mounting groove 120, two bottom notches 123 on the two distal ends of the bottom side of the vertical inner side panel 121, a finger strip 124 outwardly extending from the bottom side of the vertical outer side panel 122, and a plurality of projections 125 respectively extending from the finger strip 124 and suspending in the bottom mounting groove 120. The clamping spring arms 13 are respectively axially extending from the vertical outer side panels 122 of the two channel-like mounting frames 12 in same direction and respectively curved inwards and then backwards toward the inside of the guide passage 10, each having an angled foot portion 131 respectively connected to the vertical outer side panels 122 of the two channel-like mounting frames 12, a curved clamping portion 132 at the free end, and an oblique guide portion 133 connected between the angled foot portion 131 and the curved clamping portion 132.

Figure 3:
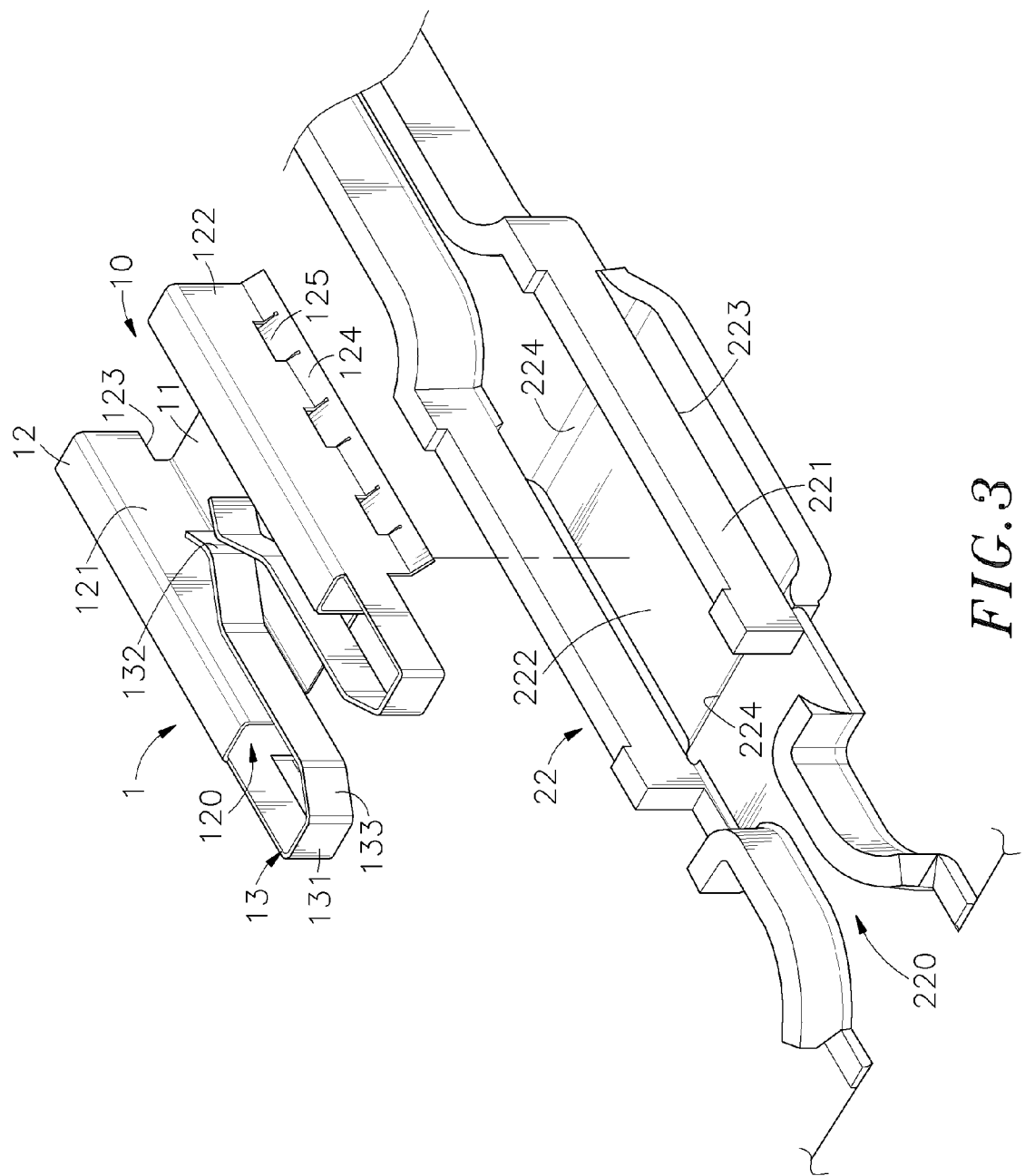
FIG. 3 is an exploded view of the present invention showing the relationship between the grounding spring plate and the associating track.

Referring to FIG. 3 and FIG. 7 again, the case 2 has an accommodation chamber 20 for accommodating a number of computer motherboard blades 3, a front opening 21 in communication with the accommodation chamber 20 through which computer motherboard blades 3 are inserted into the accommodation chamber 20, and a plurality of tracks 22 symmetrically mounted on top and bottom sides inside the accommodation chamber 20 and holding one grounding spring plate 1 each. Each track 22 comprises two rails 221, a sliding way 120 defined between the two rails 221 for the insertion of the computer motherboard blade 3, a recessed portion 222 formed in the sliding way 120 near the front opening 21 of the case 20 and defining with the bottom edge of each rail 221 a respective crevice 223, and two steps 224 transversely disposed at the front and rear sides of the recessed portion 222.

Figure 4:
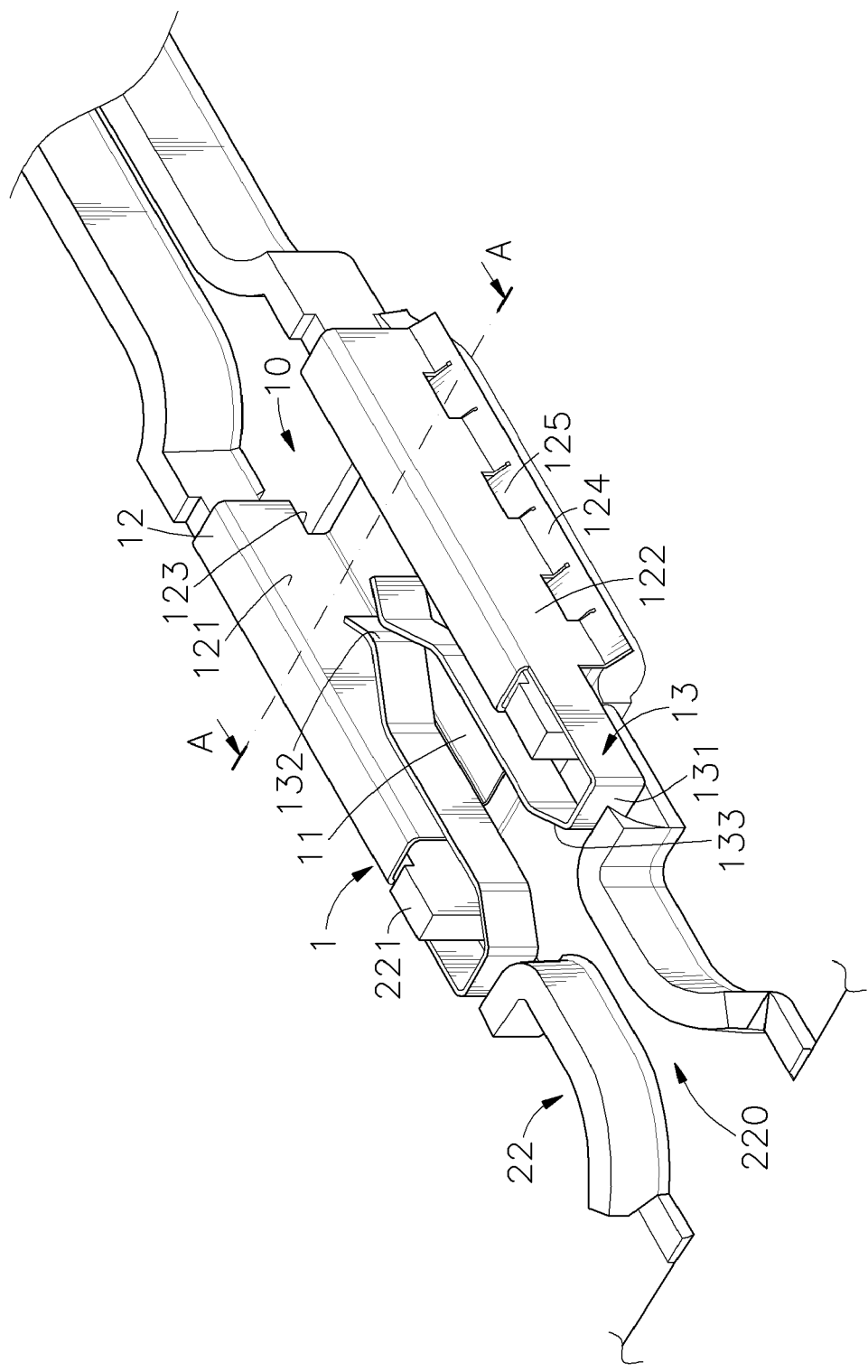
FIG. 4 corresponds to FIG. 3, showing the grounding spring plate fastened to the associating track.

Referring to FIGS. 4~6 and FIGS. 3 and 7 again, when mounting one grounding spring plate 1 on one track 22, aim the flat base 11 at the recessed portion 222 and then attach the grounding spring plate 1 to the track 22 to have the rails 221 be respectively engaged into the bottom mounting grooves 120 of the two channel-like mounting frames 12 and the vertical inner side panels 121 and vertical outer side panels 122 of the channel-like mounting frames 12 be respectively attached to rails 221 at two sides and also to have the projections 125 be respectively engaged into the crevices 223 to secure the grounding spring plate 1 to the track 22 positively. By means of the bottom notches 123, the flat base 11 can smoothly be fitted into the recessed portion 222 of the track 22.

After installation of the grounding spring plate 1 in the track 22, the flat base 11 is accommodated in the recessed portion 222 and stopped between the two steps 224. At this time, the guide passage 10 of the grounding spring plate 1 is in coincidence with the sliding way 220 of the track 22, and the two clamping spring arms 13 are in alignment with the sliding way 220.

Therefore, when the user imparts a downward pressure to the grounding spring plate 1 against the track 22 with the hand, the grounding spring plate 1 is forced into engagement with the track 22. When removing the grounding spring plate 1 from the track 22, pull the finger strips 124 outwards to disengage the projections 125 from the respective crevices 223, and then pull the grounding spring plate 1 upwards from the track 22.

Figure 8:
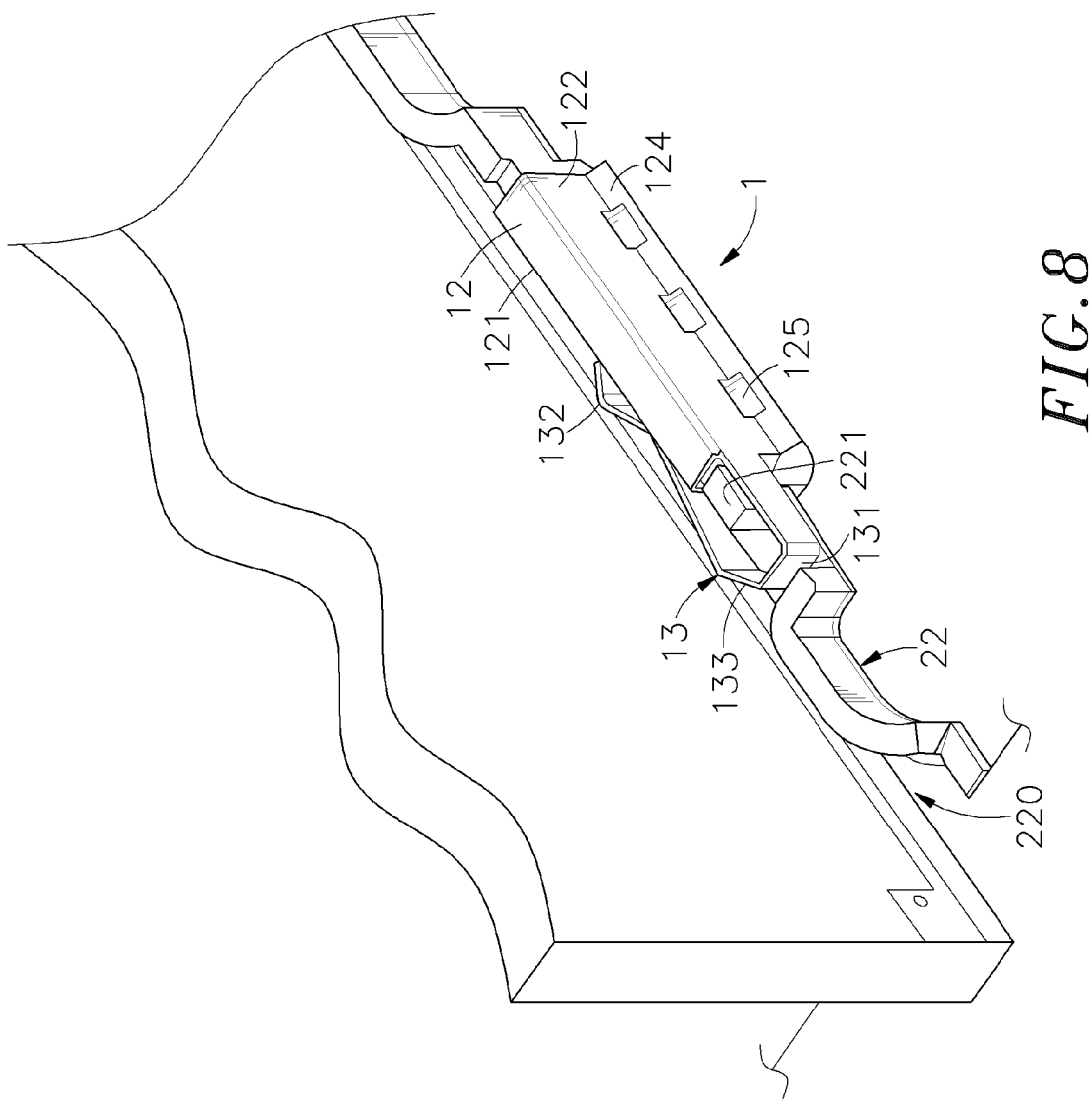
FIG. 8 is a schematic drawing showing a computer motherboard blade inserted into the grounding spring plate on the associating track according to the present invention.
Figure 9:
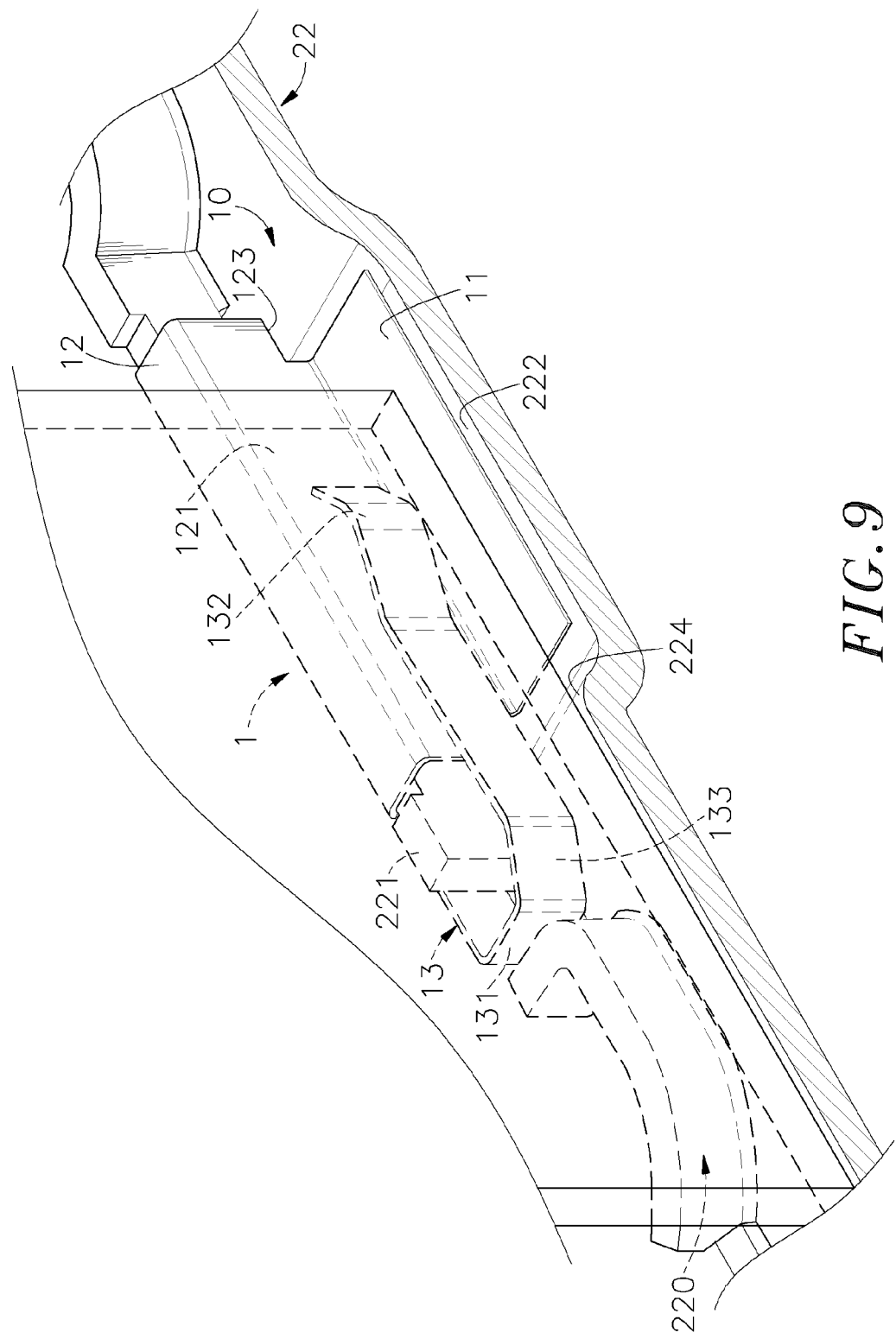
FIG. 9 is a schematic perspective, sectional elevational view showing a computer motherboard blade inserted into the grounding spring plate on the associating track according to the present invention.

Referring to FIGS. 8 and 9 and FIG. 7 again, each computer motherboard blade 3 comprises a motherboard 31, electronic component parts 32 installed in the motherboard 31, an I/O (input/output) face panel 33 fastened to one side of the motherboard 31 at right angles, and two grounding terminals 34 respectively arranged at the top and bottom sides of the motherboard 31. When mounting one computer motherboard blade 3 in the accommodation chamber 20 of the case 2, aim the motherboard 31 of the computer motherboard blade 3 at the selected track 22, and then insert the motherboard 31 into the sliding way 220 of the selected track 22. When the motherboard 31 is inserted into the sliding way 220, the oblique guide portions 133 of the clamping spring arms 13 of the associating grounding spring plate 1 guide the motherboard 31 into the guide passage 10 of the associating grounding spring plate 1, and at the same time the curved clamping portions 132 of the clamping spring arms 13 clamp the motherboard 31, preventing biasing or vibration of the computer motherboard blade 3. Because the flat base 11 of the grounding spring plate 1 is fitted into the recessed portion 22 of the associating track 22, the flat base 11 does not hinder insertion of the computer motherboard blade 3 into the guide passage 10, i.e., the moving motherboard 31 does not strike the front edge of the flat base 11 when it is guided by the oblique guide portions 133 into the guide passage 10, preventing heavy friction between the motherboard 31 and the grounding spring plate 1, or damage to the grounding spring plate 1 or the computer motherboard blade 3.

After installation of one computer motherboard blade 3 in the accommodation chamber 20 of the case 2, the two clamping spring arms 13 of the associating grounding spring plate 1 are disposed in contact with the grounding terminal 34 at the bottom side of the motherboard 31, constituting a grounding loop. By means of the clamping action of the clamping spring arms 13 on two opposite sides of the motherboard 31, the inserted computer motherboard blade 3 is kept in position. If one of the two clamping spring arms 13 starts to wear, the other of the two clamping spring arms 13 still functions well to support the associating motherboard 31 in place.

Figure 10:
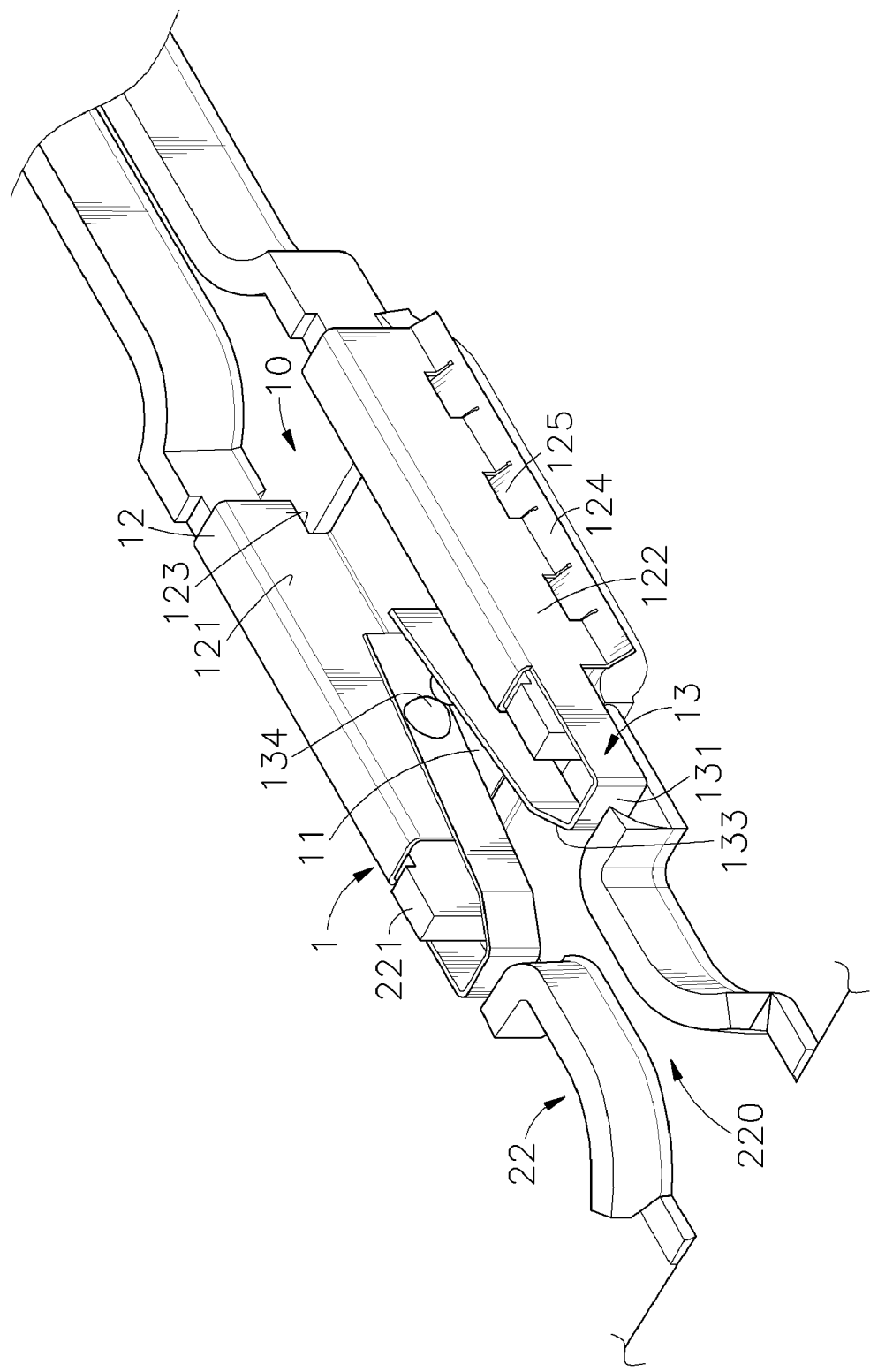
FIG. 10 is a perspective view of an alternate form of the present invention.
Figure 11:
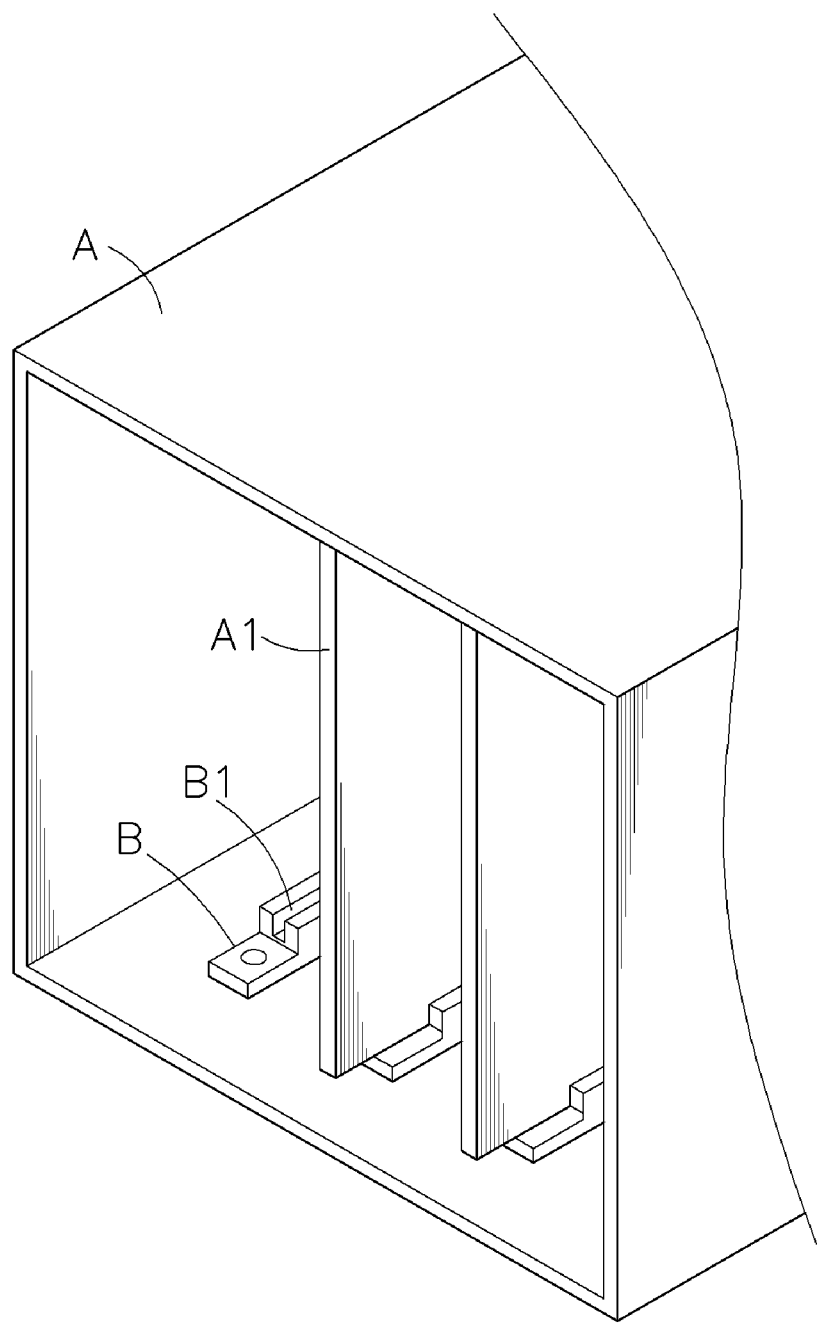
FIG. 11 is a schematic drawing showing a computer motherboard blade mounting structure in a blade server according to the prior art.
Figure 12:
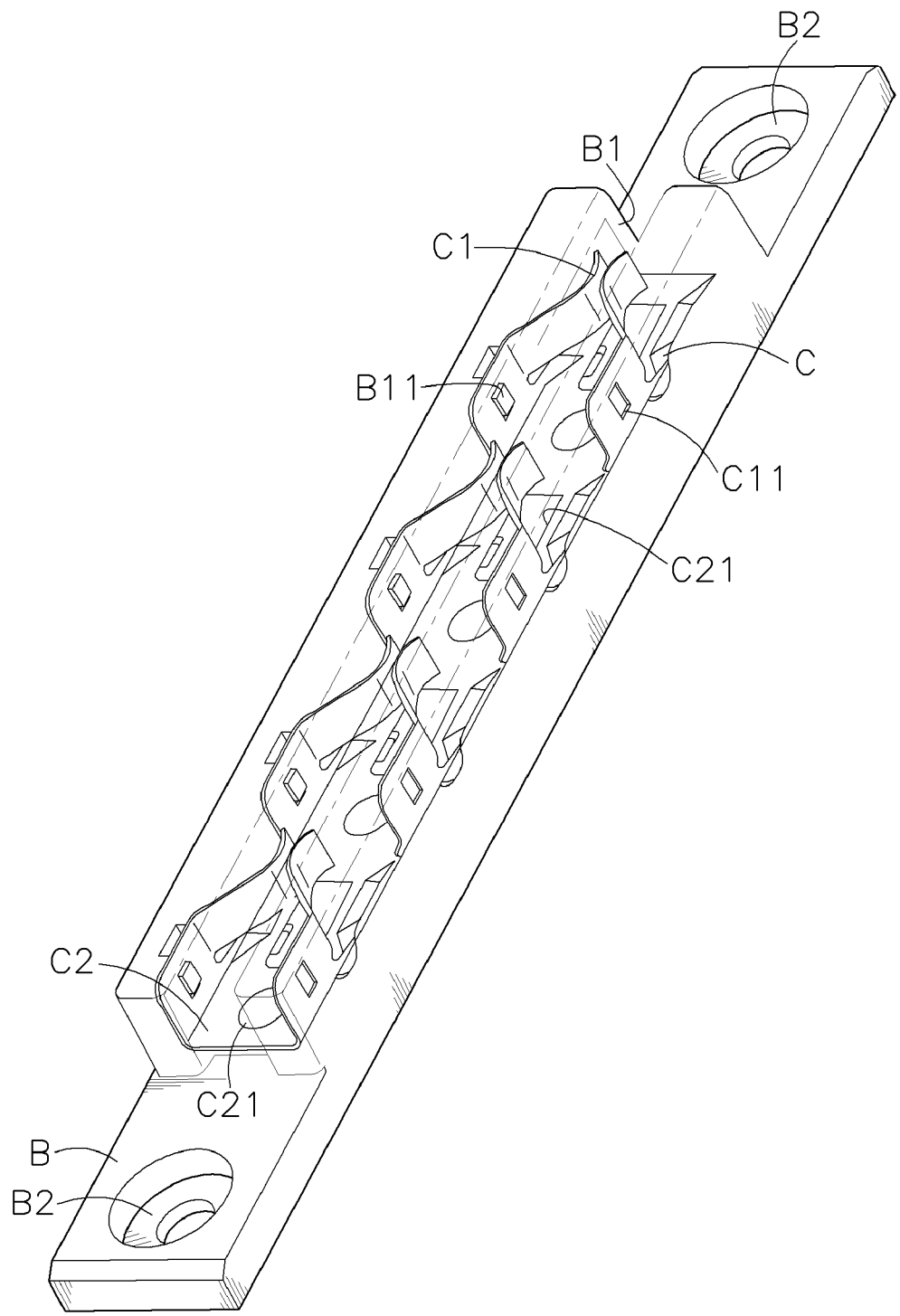
FIG. 12 is a perspective view showing a metal guide mounted in a track according to the prior art.
Figure 13:
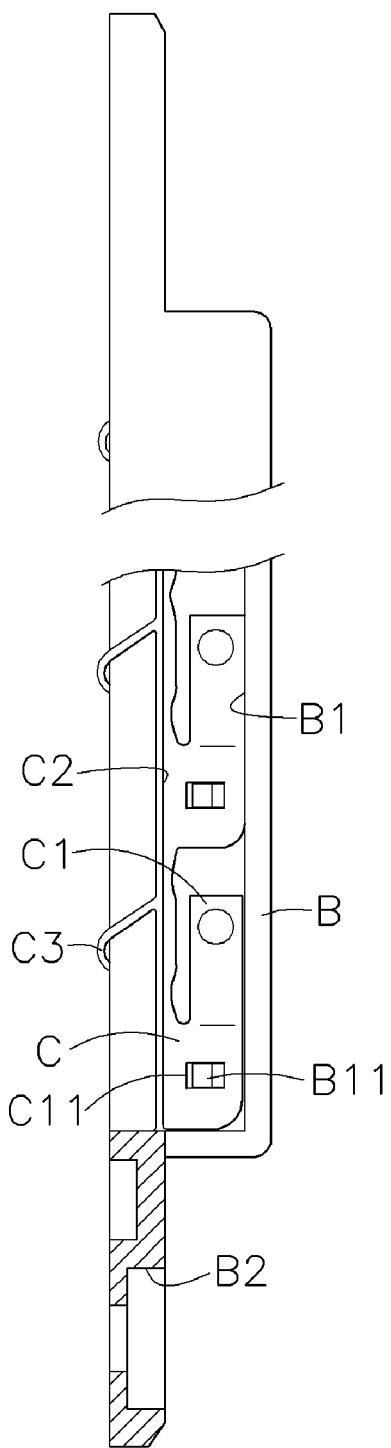
FIG. 13 is a schematic side view showing the metal guide fastened to the track according to the prior art.
Figure 14:
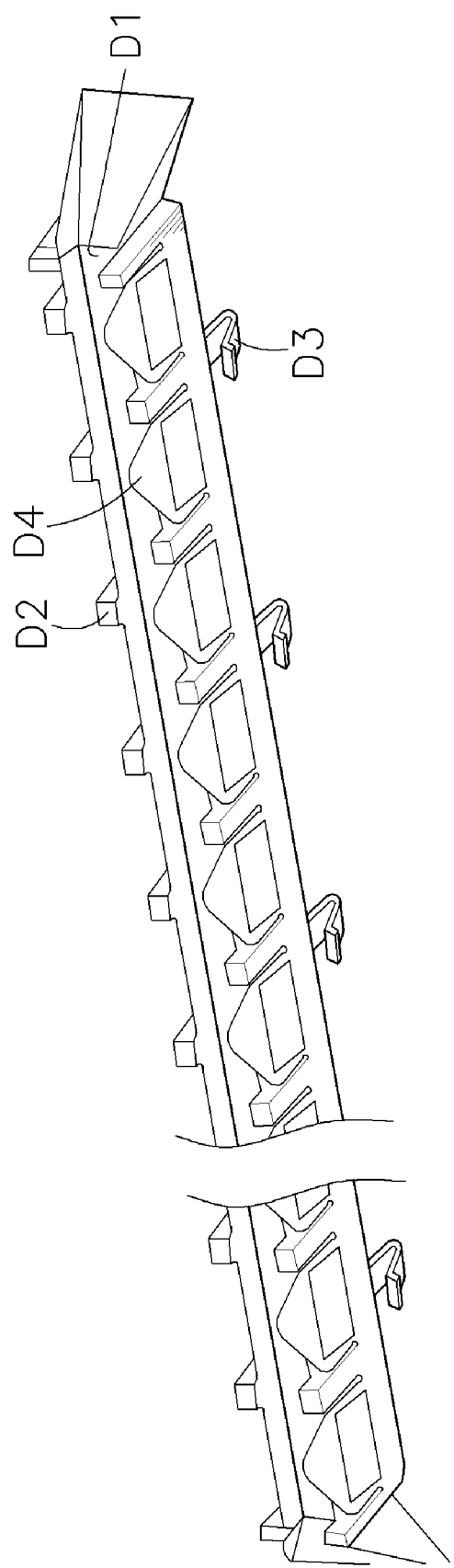
FIG. 14 is a schematic drawing showing the outer appearance of a guide track for blade server according to the prior art.
Figure 15:
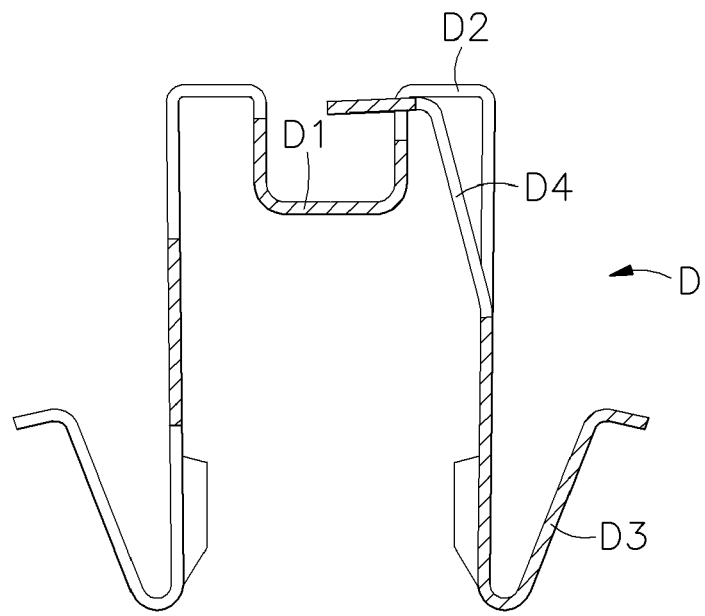
FIG. 15 is a sectional view in an enlarged scale of the guide track shown in FIG. 14.
Figure 16:
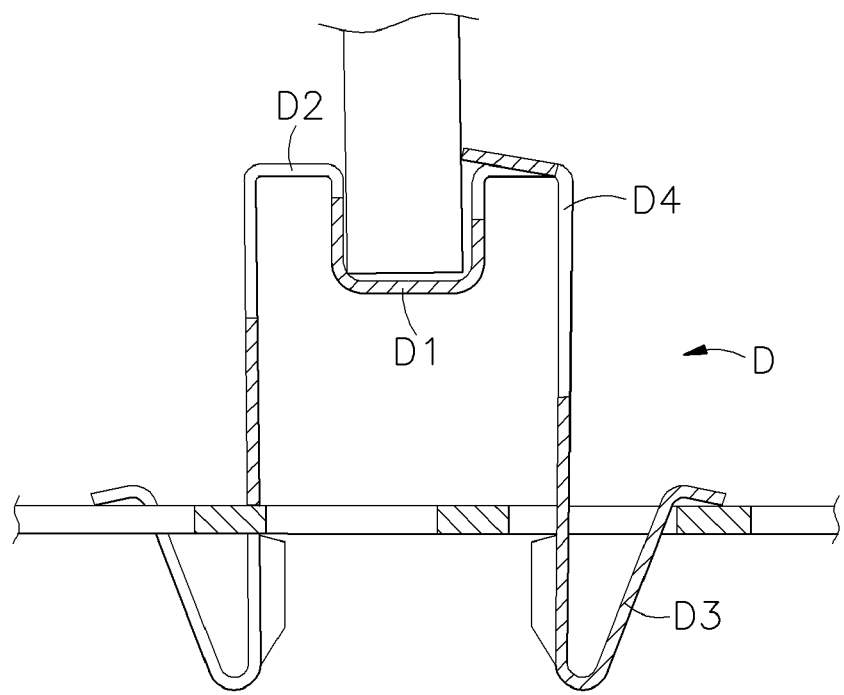
FIG. 16 is a sectional view, showing the prior art guide track installed.

FIG. 10 illustrates an alternate form of the present invention. According to this embodiment, the curved clamping portion 132 of each clamping spring arm 13 is a raised clamping portion 134 protruded from one side of the straight free end of the respective clamping spring arm 13. When the computer motherboard blade 3 is inserted in position, the raised clamping portions 134 of the two clamping spring arms 13 are respectively clamped on two opposite sides of the motherboard 31 of the computer motherboard blade 3 and disposed in positive contact with the grounding terminal 34 at the bottom side of the motherboard 31, assuring positive grounding of the motherboard 31.

As indicated above, the invention provides a grounding spring plate mounting structure for blade server, which has the following features:

1. The flat base 11 of the grounding spring plate 1 is fitted into the recessed portion 222 in the associating track 22, the two channel-like mounting frames 12 of the grounding spring plate 1 are respectively mounted on the two rails 221 of the associating track 22, and the two clamping spring arms 13 are suspending in the guide passage 10. When the motherboard 31 is inserted into the sliding way 220, the oblique guide portions 133 of the clamping spring arms 13 guide the inserted motherboard 31 in position, preventing heavy friction between the motherboard 31 and the flat base 11, and allowing the curved clamping portions 132 of the suspending clamping spring arms 13 to clamp the motherboard 31 and to further hold the motherboard 31 positively in position. Therefore, the motherboard 31 can smoothly be inserted into or moved out of the associating track 22.

2. Simply forcing the grounding spring plate 1 downwards with the hand, the projections 125 of the grounding spring plate 1 are automatically forced into the respective crevices 223 and engaged with the rails 221 to secure the grounding spring plate 1 firmly to the associating track 22. When pulling the finger strips 124 outward, the projections 125 are disengaged from the crevices 223, for allowing removal of the grounding spring plate 1 from the track 22.

3. The two clamping spring arms 13 are respectively forwardly extended from the channel-like mounting frames 12 and then turned backwards toward the inside of the guide passage 10 above the flat base 11 for clamping the inserted motherboard 31 from two opposite sides to hold the inserted motherboard 31 positively in position. Further, the clamping spring arms 13 each have an oblique guide portion 133 that guide the inserted motherboard 31 into the guide passage 10 for enabling the curved clamping portions 132 of the clamping spring arms 13 to clamp the inserted motherboard 31 and to touch the grounding terminal 34 at the bottom side of the inserted motherboard 31 positively.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A grounding spring plate mounting structure comprising:
a plurality of tracks symmetrically arranged on top and bottom sides in an accommodation chamber inside a case for blade server and extending to a front opening of said case, said tracks each comprising two rails arranged in parallel, a sliding way defined between said rails for receiving a computer motherboard blade having grounding terminals on top and bottom sides of a motherboard thereof, and a recessed portion formed on said sliding way near the front opening of said case; and
a plurality of metal grounding spring plates respectively mounted on said tracks for securing computer motherboard blades in said tracks and grounding the inserted computer motherboard blades, said metal grounding spring plates each comprising a flat base fitted into the recessed portion of the associating track, two channel-like mounting frames disposed at two sides of said flat base and respectively mounted on the rails of the associating track and defining with said flat base a guide passage in communication with the sliding way of the associating track for receiving the computer motherboard blade being inserted into the sliding way of the associating track, and two clamping spring arms respectively extending from said channel-like mounting frames and suspending in said guide passage for clamping the inserted computer motherboard blade from two opposite sides.

2. The grounding spring plate mounting structure as claimed in claim 1, wherein said channel-like mounting frames each have a vertical inner side panel and a vertical outer side panel arranged in parallel and defining a bottom mounting groove for receiving the associating rail of the associating track.

3. The grounding spring plate mounting structure as claimed in claim 2, wherein said channel-like mounting frames each have a bottom notch on each of front and rear sides of the respective vertical inner side panel for enabling the flat base of the respective grounding spring plate to be fitted into the recessed portion of the associating track.

4. The grounding spring plate mounting structure as claimed in claim 2, wherein said tracks each have a crevice defined between each rail thereof and the respective recessed portion; said channel-like mounting frames each having a finger strip respectively outwardly extending from a bottom side of the respective vertical outer side panel and a plurality of projections respectively protruded from said finger strip and suspending in the bottom mounting groove of the respective channel-like mounting frame for engaging into the corresponding crevice to secure the respective channel-like mounting frame to the associating rail of the associating track.

5. The grounding spring plate mounting structure as claimed in claim 1, wherein the clamping spring arms of each of said metal grounding spring plates each have an angled foot portion respectively connected to the vertical outer side panels of the two channel-like mounting frames of the respective grounding spring plate, a free end suspending in the guide passage of the respective grounding spring plate, and a curved clamping portion at said free end.

6. The grounding spring plate mounting structure as claimed in claim 5, wherein the clamping spring arms of each of said metal grounding spring plates each further have an oblique guide portion connected between the respective angled foot portion and the respective free end.

7. The grounding spring plate mounting structure as claimed in claim 5, wherein the curved clamping portion of each of said clamping spring arms is a raised clamping portion protruded from one side of the free end of the respective clamping spring arm.

8. The grounding spring plate mounting structure as claimed in claim 1, wherein the clamping spring arms of each of said metal grounding spring plates are disposed in contact with one grounding terminal of the motherboard when clamped on the inserted computer motherboard blade.

9. A metal grounding spring plate for fastening to a track in a case for blade server to secure and ground a computer motherboard blade, comprising a flat base for fitting into a recessed portion of said track in said case, two channel-like mounting frames disposed at two sides of said flat base for mounting on two parallel rails of said track in said case and defining with said flat base a guide passage in communication with a sliding way of said track in said case for receiving a computer motherboard blade, and two clamping spring arms respectively extending from said channel-like mounting frames and suspending in said guide passage for clamping the inserted computer motherboard blade from two opposite sides.

10. The metal grounding spring plate as claimed in claim 9, wherein said channel-like mounting frames each have a vertical inner side panel and a vertical outer side panel arranged in parallel and defining a bottom mounting groove for receiving one rail of said track.

11. The metal grounding spring plate as claimed in claim 10, wherein said channel-like mounting frames each have a bottom notch on each of front and rear sides of the respective vertical inner side panel for enabling the flat base of the respective grounding spring plate to be fitted into the recessed portion of said track.

12. The metal grounding spring plate as claimed in claim 10, wherein said channel-like mounting frames each have a finger strip respectively outwardly extending from a bottom side of the respective vertical outer side panel and a plurality of projections respectively protruded from said finger strip and suspending in the bottom mounting groove of the respective channel-like mounting frame for engaging into a crevice between the corresponding rail and the recessed portion of said track to secure the respective channel-like mounting frame to the corresponding rail of said track.

13. The metal grounding spring plate as claimed in claim 9, wherein said clamping spring arms each have an angled foot portion respectively connected to the vertical outer side panels of said channel-like mounting frames, a free end suspending in said guide passage, and a curved clamping portion at said free end.

14. The metal grounding spring plate as claimed in claim 13, wherein said clamping spring arms each further have an oblique guide portion connected between the respective angled foot portion and the respective free end.

15. The metal grounding spring plate as claimed in claim 13, wherein the curved clamping portion of each of said clamping spring arms is a raised clamping portion protruded from one side of the free end of the respective clamping spring arm.

16. The metal grounding spring plate as claimed in claim 13, wherein said clamping spring arms are disposed in contact with one grounding terminal of the inserted computer motherboard blade to ground the inserted computer motherboard blade when clamped on the inserted computer motherboard blade.

* * * * *